US012660282B2

(12) United States Patent
Liao et al.

(10) Patent No.: US 12,660,282 B2
(45) Date of Patent: Jun. 16, 2026

(54) TRENCH METAL-OXIDE-SEMICONDUCTOR DEVICE WITH SELF-ALIGNED CONTACTS

(71) Applicant: Vanguard International Semiconductor Corporation, Hsinchu (TW)

(72) Inventors: Po-Hsiang Liao, New Taipei City (TW); Sheng-Wei Fu, Taoyuan City (TW); Chung-Yeh Lee, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 903 days.

(21) Appl. No.: 17/849,689

(22) Filed: Jun. 26, 2022

(65) Prior Publication Data

US 2023/0420529 A1     Dec. 28, 2023

(51) Int. Cl.
H10D 64/27        (2025.01)
H10D 30/66        (2025.01)
H10D 64/00        (2025.01)
H10D 64/01        (2025.01)
H10W 20/00        (2026.01)

(52) U.S. Cl.
CPC ......... H10D 64/513 (2025.01); H10D 30/668 (2025.01); H10D 64/01 (2025.01); H10D 64/117 (2025.01); H10W 20/069 (2026.01)

(58) Field of Classification Search
CPC .... H10D 64/513; H10D 30/668; H10D 64/01; H10D 64/117; H10D 30/0293; H10D 30/0295; H10D 30/0297; H10D 64/256; H10D 64/516; H01L 21/76897
See application file for complete search history.

(56) References Cited

U.S. PATENT DOCUMENTS

| | | | | |
|---|---|---|---|---|
| 7,385,248 | B2 * | 6/2008 | Herrick ................ | H10D 64/117 257/E29.2 |
| 8,193,579 | B2 * | 6/2012 | Yoshimochi ......... | H10D 64/256 257/334 |
| 2014/0170823 | A1 * | 6/2014 | Lin .................... | H10D 30/0293 438/270 |

(Continued)

FOREIGN PATENT DOCUMENTS

| | | | | |
|---|---|---|---|---|
| CN | 104009083 A | * | 8/2014 | ........... H01L 21/308 |

*Primary Examiner* — Sue A Purvis
*Assistant Examiner* — Jordan M Klein
(74) *Attorney, Agent, or Firm* — Winston Hsu

(57) ABSTRACT

A semiconductor device includes a substrate, a body region on the substrate, a source region on the body region, a first trench electrode passing through the source region, the body region and a portion of the substrate, a first dielectric cap layer, a first dielectric liner and a conductive layer. The first dielectric cap layer includes a first dielectric portion directly above the first trench electrode and first dielectric spacers on two opposite sides of the first dielectric portion. The first dielectric liner surrounds the first trench electrode and the first dielectric portion. The conductive layer covers the first dielectric cap layer and includes an electrode contact. The electrode contact includes a first portion in the body region and a second portion adjacent to one of the first dielectric spacers, where the first and second portions have the same width.

10 Claims, 8 Drawing Sheets

(56) References Cited

U.S. PATENT DOCUMENTS

| 2015/0129988 | A1* | 5/2015 | Leobandung | .......... | H10D 30/62 |
| | | | | | 438/283 |
| 2020/0075763 | A1* | 3/2020 | Shi | ....................... | H10D 30/025 |
| 2021/0242342 | A1* | 8/2021 | Goda | ................... | H10D 62/127 |

* cited by examiner

TRENCH METAL-OXIDE-SEMICONDUCTOR DEVICE WITH SELF-ALIGNED CONTACTS

BACKGROUND OF THE INVENTION

1. Field of the Invention

The present disclosure relates generally to semiconductor devices, and more particularly to trench metal-oxide-semiconductor (trench MOS) devices with self-aligned contacts and fabrication methods thereof.

2. Description of the Prior Art

In the fabrication of semiconductor devices, photolithography and etching processes are commonly used to form openings, such as openings for electrode contacts. While the performance of semiconductor device is gradually improved, the size of the semiconductor device is also gradually reduced. The reduction of the size of the semiconductor device makes the fabrication of openings is largely dependent on the alignment capability of the photolithography process. In general, the alignment capability of the photolithography process is limited not only by the physical limitations of the exposure equipment, but also by the operation of various steps of the photolithography process, such as photoresist deposition, photo-mask alignment, exposure and development processes. The misalignment in the photolithography process will cause the position of openings to be shifted, so that the position of electrode contacts subsequently formed in the openings will also be shifted, thereby resulting in electrical difference or short circuit of the semiconductor devices. As a result, the performances of the semiconductor devices are reduced or the semiconductor devices fail, so that the size of the semiconductor devices cannot be further reduced. Therefore, the industry needs to improve the fabrication of openings for the semiconductor devices whose size is shrinking.

SUMMARY OF THE INVENTION

In view of this, the present disclosure provides semiconductor devices and fabrication methods thereof, which improve the fabrication of contact openings to form self-aligned contacts, so as to overcome the misalignment of the conventional photolithography process. Moreover, the self-aligned contacts are suitable for semiconductor devices with increasingly reduced size, such as trench MOS devices with a pitch of cells of about 0.2 micrometers ($\mu m$) to about 0.65 $\mu m$. The self-aligned contacts may be used to form electrode contacts that are disposed between trench electrodes.

According to an embodiment of the present disclosure, a semiconductor device is provided and includes a substrate, a body region, a source region, a first trench electrode, a first dielectric cap layer, a first dielectric liner and a conductive layer. The substrate has a first conductivity type. The body region is disposed on the substrate and has a second conductivity type opposite to the first conductivity type. The source region is disposed on the body region. The first trench electrode is disposed to pass through the source region, the body region and at least a portion of the substrate. The first dielectric cap layer is disposed on the first trench electrode, where the first dielectric cap layer includes a first dielectric portion and a plurality of first dielectric spacers. The first dielectric portion is located directly above the first trench electrode, and the first dielectric spacers are located on two opposite sides of the first dielectric portion. The first dielectric liner surrounds the first trench electrode and the first dielectric portion. The conductive layer covers the first dielectric portion and these first dielectric spacers, where the conductive layer includes an electrode contact. The electrode contact includes a first portion disposed in the body region, and a second portion adjacent to one of these first dielectric spacers, where the first portion and the second portion have the same width.

According to an embodiment of the present disclosure, a method of fabricating a semiconductor device is provided and includes the following steps. A substrate having a first conductivity type is provided, and a first trench and a second trench are formed in the substrate. The first trench and the second trench are filled up with a conductive material. The conductive material in the first trench and the second trench is etched to form a first recess on a first trench electrode and a second recess on a second trench electrode. A dielectric layer is deposited to fill up the first recess and the second recess to form a first dielectric portion on the first trench electrode and a second dielectric portion on the second trench electrode. The substrate is etched to expose a plurality of sidewalls of the first dielectric portion and a plurality of sidewalls of the second dielectric portion. A second dielectric layer is conformally formed on the substrate, the first dielectric portion and the second dielectric portion. The second dielectric layer is etched back to form a plurality of first dielectric spacers on the sidewalls located on two opposite sides of the first dielectric portion and a plurality of second dielectric spacers on the sidewalls located on two opposite sides of the second dielectric portion. The first dielectric portion and the first dielectric spacers constitute a first dielectric cap layer. The second dielectric portion and the second dielectric spacers constitute a second dielectric cap layer. The substrate is etched by using the first dielectric cap layer and the second dielectric spacers as a mask to form a contact opening. In addition, a conductive layer is formed in the contact opening and on the first dielectric cap layer and the second dielectric cap layer, where the conductive layer includes an electrode contact located in the contact opening and between the first trench electrode and the second trench electrode.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
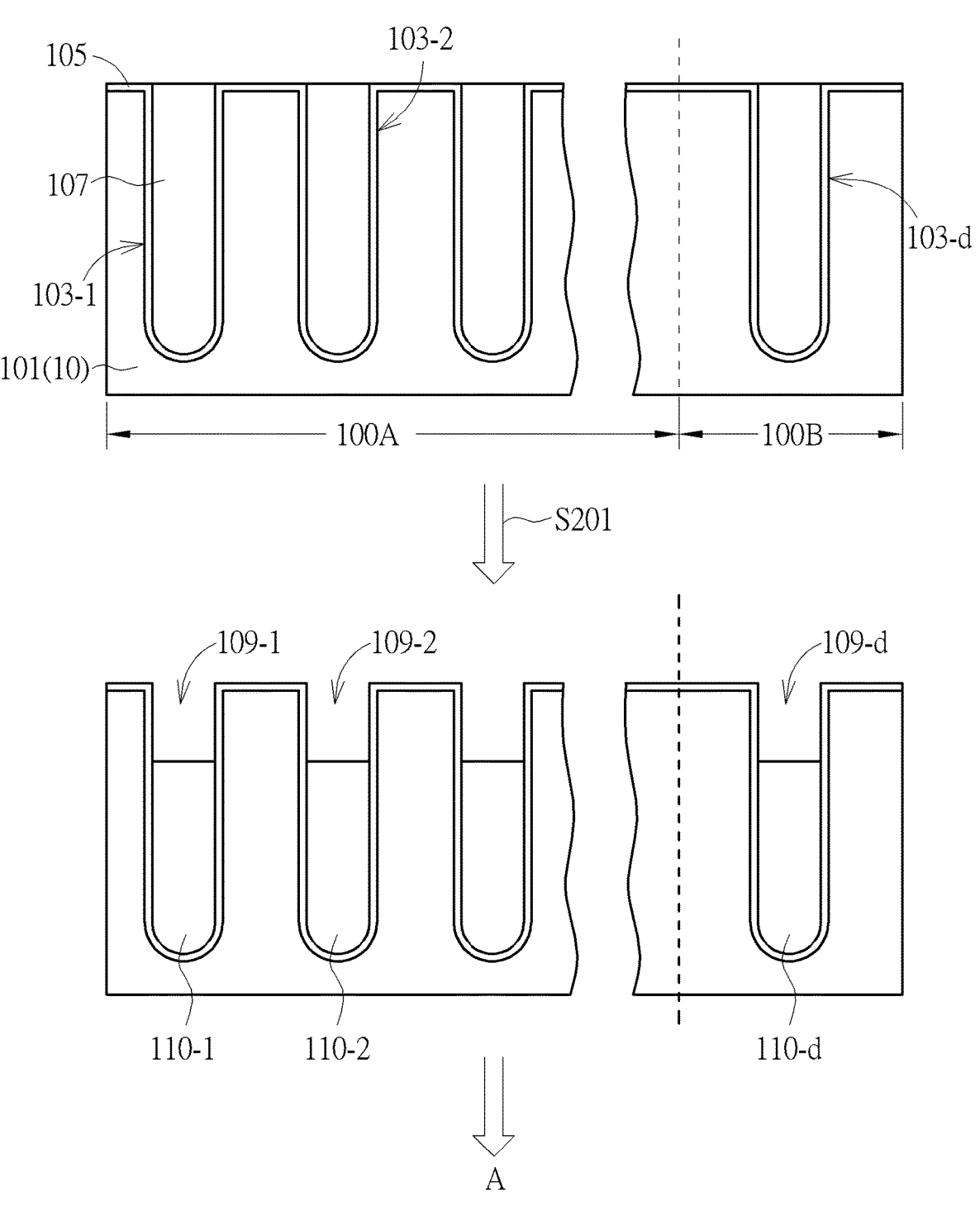
FIG. 1, FIG. 2, FIG. 3, FIG. 4, FIG. 5, and FIG. 6 are schematic cross-sectional views of various stages of a method of fabricating a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

Figure 6:
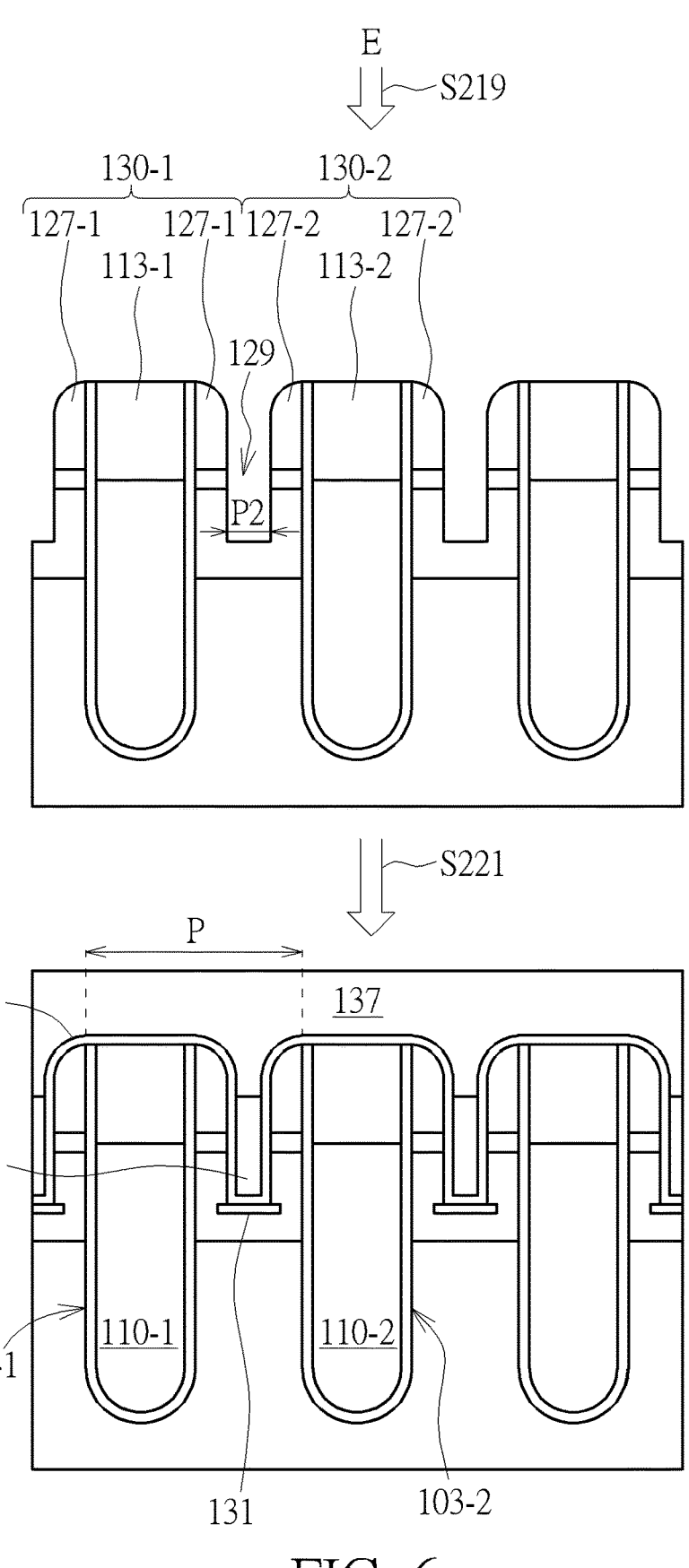

The present disclosure relates to semiconductor devices such as trench MOS devices with self-aligned contacts and fabrication methods thereof. The self-aligned contact of the semiconductor device can avoid the overlay shift problem of the conventional photolithography process, so that the self-aligned contact is suitable for the trench MOS devices with reduced size, for example, the pitch of cells may be about 0.2 micrometers ($\mu m$) to about 0.65 $\mu m$, and is usually about 0.5 $\mu m$ or about 0.55 $\mu m$. The pitch P of cells is illustrated in FIG. 6, for example, it is the pitch between two adjacent trenches.

FIG. 1 to FIG. 6 are schematic cross-sectional views of various stages of a method of fabricating a semiconductor device according to an embodiment of the present disclosure. Referring to FIG. 1, firstly, a substrate 101 is provided. In one embodiment, the substrate 101 is a semiconductor substrate having a first conductivity type, such as an n-type silicon substrate. In another embodiment, the substrate 101 may be an n-type silicon epitaxial layer formed on a semiconductor substrate. The substrate 101 may include a cell region 100A and a termination region 100B. Both the cell region 100A and the termination region 100B belong to a device region of the semiconductor device, where an electrode contact is formed in the cell region 100A in subsequent processes, and the electrode contact is not formed in the termination region 100B in the subsequent processes. For example, trench MOS transistors are formed in the cell region 100A, and conductive pads are formed in the termination region 100B, or the termination region 100B is used as a dummy region.

According to an embodiment of the present disclosure, multiple trenches, such as a first trench 103-1, a second trench 103-2, etc., are formed in the cell region 100A of the substrate 101, and a dummy trench 103-d is formed in the termination region 100B. A dielectric liner 105 is conformally formed on the sidewalls and the bottom surfaces of each of the trenches 103-1, 103-2 and 103-d and on the surface of the substrate 101. Moreover, each of the trenches 103-1, 103-2 and 103-d is filled up with a conductive material 107. In some embodiments, the material of the dielectric liner 105 is, for example, silicon oxide, silicon nitride, silicon oxynitride or other dielectric materials. The dielectric liner 105 may be formed by a thermal oxidation process, a chemical vapor deposition (CVD) process, or a physical vapor deposition (PVD) process. The conductive material 107 is, for example, polysilicon, which may be formed by a low pressure chemical vapor deposition (LPCVD) process to fill up each of the trenches and be deposited on the substrate 101. In addition, a chemical mechanical planarization (CMP) process is used to make the top surface of the conductive material 107 in each of the trenches is level with the top surface of the dielectric liner 105.

Next, still referring to FIG. 1, at step S201, the conductive material 107 in each of the trenches 103-1, 103-2 and 103-d is etched to form a first recess 109-1, a second recess 109-2 and a dummy recess 109-d in the trenches 103-1, 103-2 and 103-d, respectively. Moreover, the portions of the conductive material 107 remained in the trenches 103-1, 103-2 and 103-$d$ constitute a first trench electrode 110-1, a second trench electrode 110-2 and a dummy trench electrode 110-$d$, respectively. The first recess 109-1 is located on the first trench electrode 110-1, the second recess 109-2 is located on the second trench electrode 110-2, and the dummy recess 109-$d$ is located on the dummy trench electrode 110-$d$. In some embodiments, the depth of each of the recesses 109-1, 109-2 and 109-$d$ is about 0.2 μm to about 2 μm. The conductive material 107 may be etched by a wet etching or a dry etching process that has an etching selectivity to the conductive material 107, so as to form the recesses 109-1, 109-2 and 109-$d$. The depths of the recesses 109-1, 109-2 and 109-$d$ are related to the thicknesses of dielectric portions 113-1, 113-2 and 113-$d$ formed in the subsequent step S205.

Figure 2:
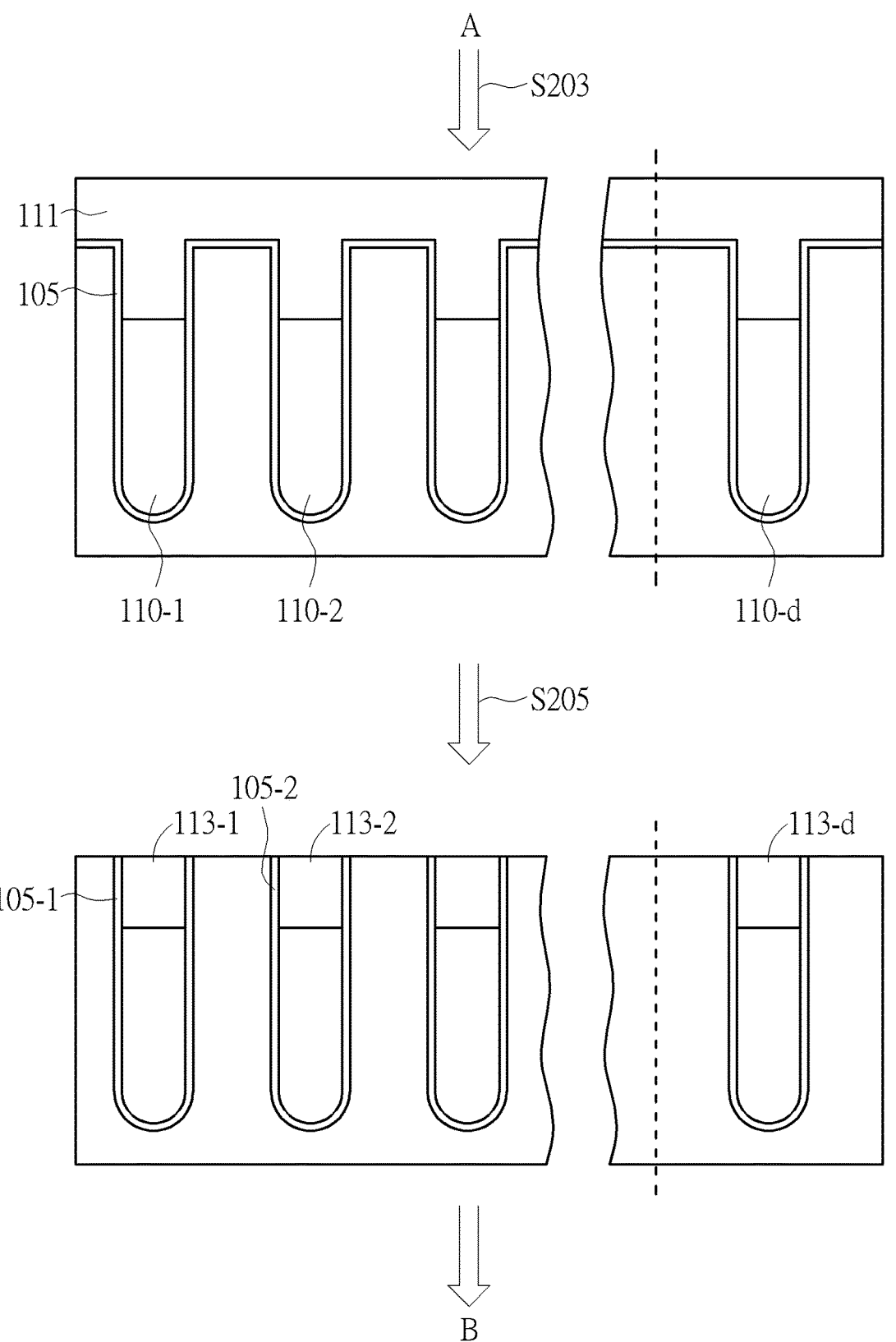

Then, referring to FIG. 2, at step S203, a first dielectric layer 111 is deposited to fill up each of the recesses, such as the first recess 109-1, the second recess 109-2, and the dummy recess 109-$d$. Moreover, the first dielectric layer 111 is extended out of each recess. In some embodiments, the material of the first dielectric layer 111 is, for example, silicon oxide (SiOx), silicon nitride, silicon oxynitride, aluminum oxide (Al$_2$O$_3$), hafnium oxide (HfO$_2$), zirconium oxide (ZrO$_2$), titanium oxide (TiO$_2$) or other dielectric materials. The first dielectric layer 111 may be formed by a CVD or PVD process.

Thereafter, still referring to FIG. 2, at step S205, a CMP process or an etching process is used to remove a portion of the dielectric liner 105 and a portion of the first dielectric layer 111 outside the recesses 109-1, 109-2 and 109-$d$, so that the top surface of the first dielectric layer 111 in each trench is level with the top surface of the substrate 101. As a result, a first dielectric portion 113-1 is formed on the first trench electrode 110-1, a second dielectric portion 113-2 is formed on the second trench electrode 110-2, and a dummy dielectric portion 113-$d$ is formed on the dummy trench electrode 110-$d$. Moreover, a first dielectric liner 105-1 is formed in the first trench 103-1 to surround the first trench electrode 110-1 and the first dielectric portion 113-1. A second dielectric liner 105-2 is formed in the second trench 103-2 to surround the second trench electrode 110-2 and the second dielectric portion 113-2. Similarly, a dielectric liner is also formed in the dummy trench 103-$d$ to surround the dummy trench electrode 110-$d$ and the dummy dielectric portion 113-$d$. Moreover, the first dielectric liner 105-1 and the second dielectric liner 105-2 are separated from each other.

Figure 3:
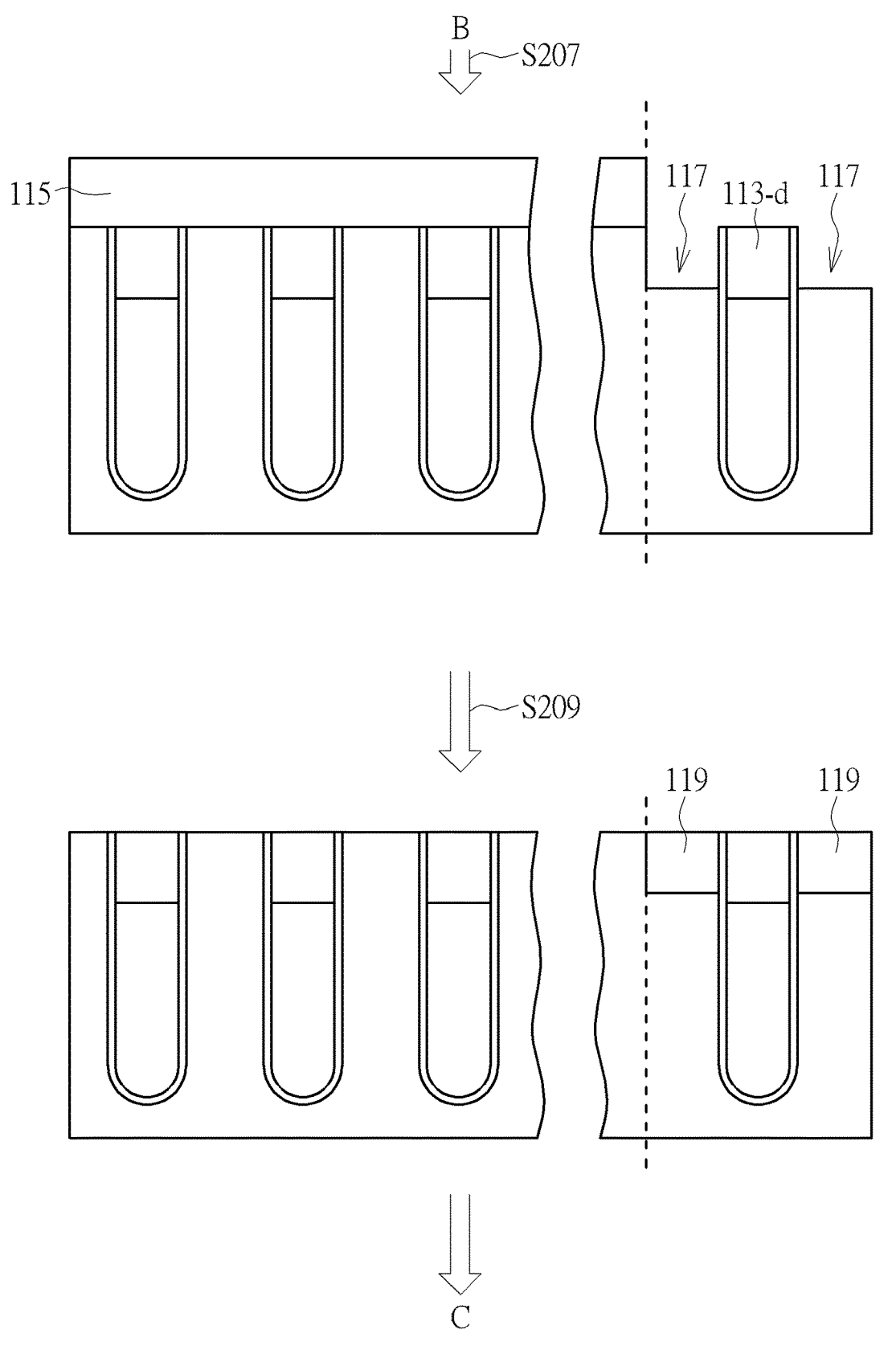

Next, referring to FIG. 3, at step S207, a photoresist 115 is formed to cover the cell region 100A, and thus the termination region 100B is exposed. Then, the termination region 100B of the substrate 101 is etched to form a recess 117 in the substrate 101, and the sidewalls of the dummy dielectric portion 113-$d$ are exposed. In some embodiments, the substrate 101 may be etched by a wet etching or dry etching process. In this etching process, the etchant has different etching rates to the substrate 101 and the dummy dielectric portion 113-$d$, i.e., the materials of the substrate 101 and the dummy dielectric portion 113-$d$ have an etching selectivity, so that a portion of the substrate 101 is removed and the dummy dielectric portion 113-$d$ is remained. In addition, in some embodiments, the bottom surface of the recess 117 may be slightly higher than or level with the bottom surface of the dummy dielectric portion 113-$d$. Thereafter, the photoresist 115 is removed. Next, still referring to FIG. 3, at step S209, a third dielectric layer 119 is deposited to fill up the recess 117 in the termination region 100B and on the substrate 101 in the termination region 100B. In some embodiments, the material of the third dielectric layer 119 is, for example, silicon oxide, silicon nitride, silicon oxynitride, aluminum oxide (Al$_2$O$_3$), hafnium oxide (HfO$_2$), zirconium oxide (ZrO$_2$), titanium oxide (TiO$_2$) or other dielectric materials. The third dielectric layer 119 may be formed by a CVD or PVD process. Then, the third dielectric layer 119 on the substrate 101 in the termination region 100B is removed by an etching back or CMP process, so that the top surface of the third dielectric layer 119 in the recess 117 is level with the top surface of the dummy dielectric portion 113-$d$.

Figure 4:
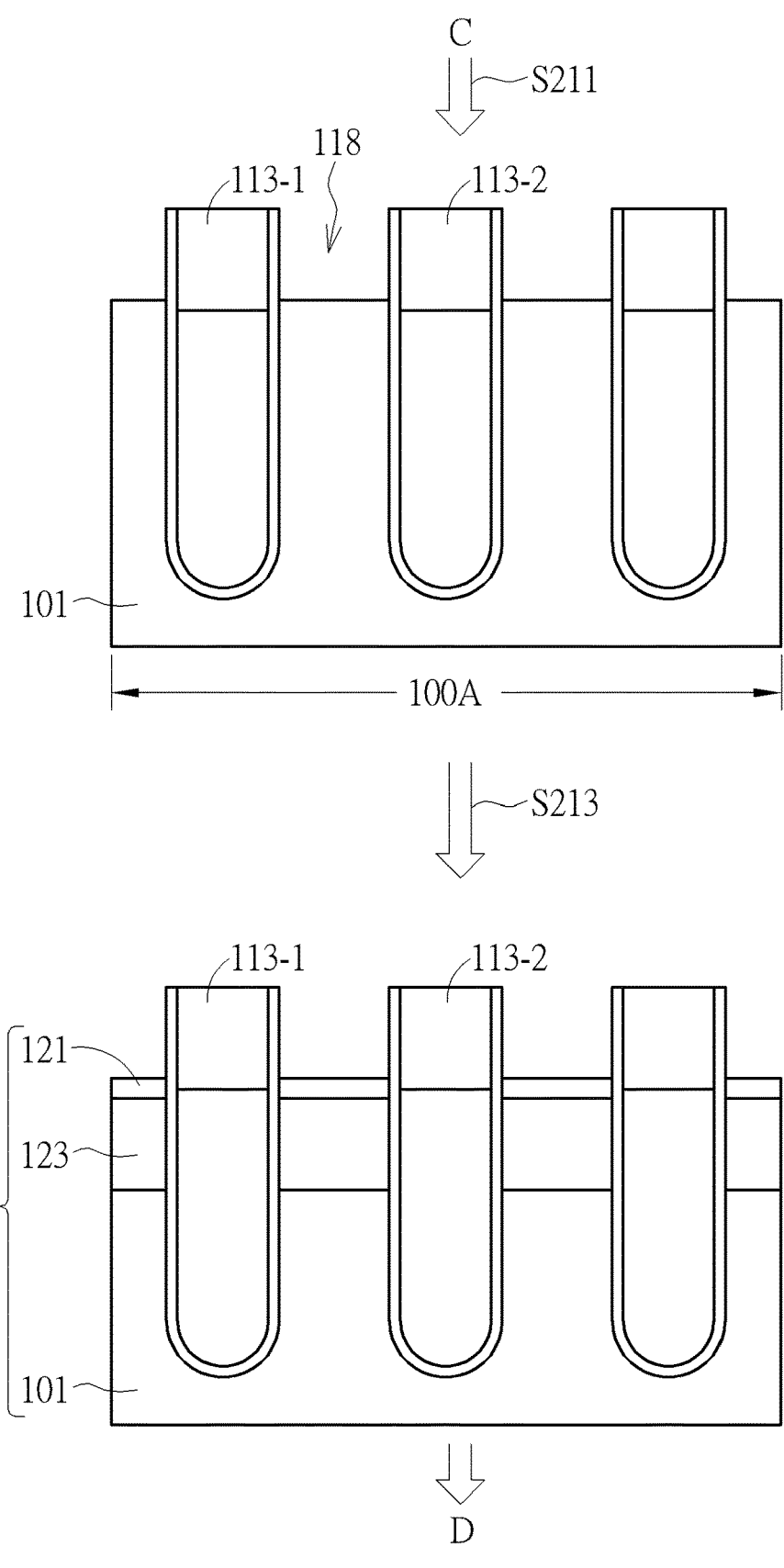

Then, referring to FIG. 4, at step S211, the substrate 101 in the cell region 100A is etched to form a recess 118 and to expose the sidewalls of the first dielectric liner 105-1 and the sidewalls of the second dielectric liner 105-2. In order to emphasize the features of the embodiments of the present disclosure, only the cell region 100A is shown in FIG. 4 to FIG. 7. In some embodiments, the substrate 101 may be etched by a wet etching or dry etching process, and in the etching process of step S211, the material of the substrate 101 has an etching selectivity to the material of each dielectric portion (i.e., the first dielectric layer 111), the material of each dielectric liner (i.e., the dielectric liner 105), and the material of the third dielectric layer 119, so as to remove a portion of the substrate 101, and each of the dielectric portions and each of the dielectric liners are remained. In addition, in some embodiments, the bottom surface of the recess 118 may be slightly higher than or level with the bottom surface of each dielectric portion (for example, the first dielectric portion 113-1 and the second dielectric portion 113-2).

Afterwards, still referring to FIG. 4, at step S213, each dielectric portion is used as a hard mask and an ion implantation process is performed to form a body region 123 in the substrate 101. The body region 123 has a second conductivity type (for example, p-type) that is opposite to the first conductivity type (for example, n-type) of the substrate 101. The body region 123 is, for example, a p-body region. Next, another ion implantation process is performed by using each dielectric portion as a hard mask to form a source region 121 on the body region 123. The source region 121 has the same first conductivity type (for example, n-type) as that of the substrate 101. Moreover, the doping concentration of the source region 121 is higher than the doping concentration of the substrate 101. According to the embodiments of the present disclosure, since both the source region 121 and the body region 123 are formed by using each dielectric portion (for example, the first dielectric portion 113-1 and the second dielectric portion 113-2) as a hard mask, the source region 121 and the body region 123 are formed in the same region of the substrate 101, i.e., the vertical projection regions of the source region 121 and the body region 123 are the same. In addition, the substrate 101, the body region 123 and the source region 121 may be collectively referred to as a substrate 10 of the semiconductor device.

Figure 5:
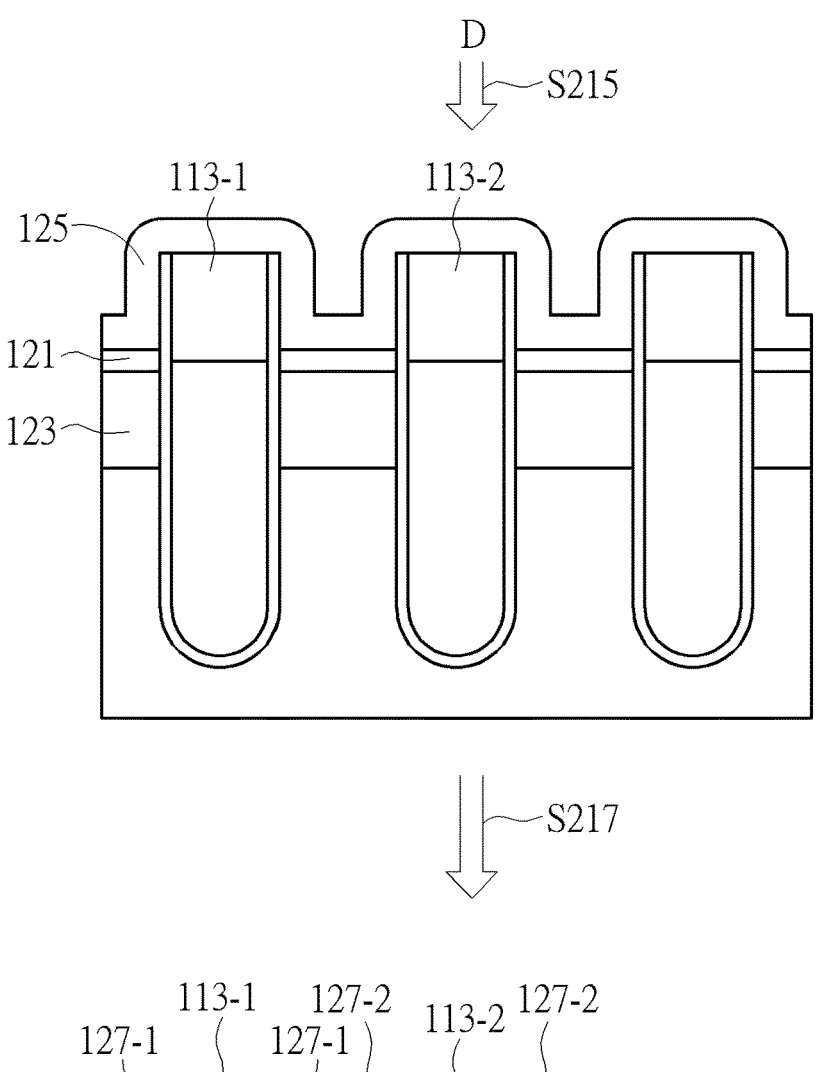
Figure 5:
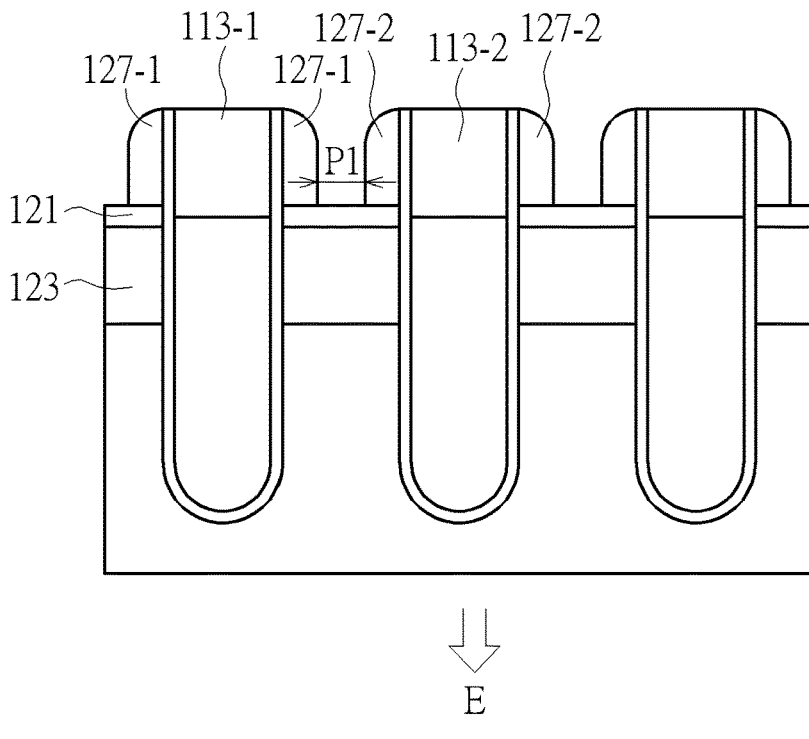

Next, referring to FIG. 5, at step S215, a second dielectric layer 125 is conformally formed on the substrate 101 and each of the dielectric portions, for example, the second dielectric layer 125 conformally covers the surface of the source region 121, the sidewalls and the top surfaces of the first dielectric portion 113-1 and the second dielectric portion 113-2, and also conformally covers the dielectric liners 105-1 and 105-2 on the sidewalls of each dielectric portion. In some embodiments, the material of the second dielectric layer 125 is, for example, silicon oxide (SiO$_x$), silicon nitride, silicon oxynitride, aluminum oxide (Al$_2$O$_3$), hafnium oxide (HfO$_2$), zirconium oxide (ZrO$_2$), titanium oxide ($TiO_2$) or other dielectric materials. The second dielectric layer 125 may be formed by a CVD or PVD process. Then, still referring to FIG. 5, at step S217, the second dielectric layer 125 is etched back to form dielectric spacers on the sidewalls of each dielectric portion, for example, to form first dielectric spacers 127-1 on the sidewalls located on two opposite sides of the first dielectric portion 113-1, and second dielectric spacers 127-2 on the sidewalls located on two opposite sides of the second dielectric portion 113-2. There is a first pitch (or referred to as a first critical dimension) P1 between the first dielectric spacer 127-1 and the second dielectric spacer 127-2 that are adjacent to each other. The etching process of etching back the second dielectric layer 125 may be an anisotropic dry etching process, so as to remove multiple horizontal portions of the second dielectric layer 125, and each of the first dielectric spacers 127-1 and the second dielectric spacers 127-2 is formed to have a vertical sidewall and a round corner. In some embodiments, after the etching back process of step S217, the source region 121 and the top surfaces of the first dielectric portion 113-1 and the second dielectric portion 113-2 are exposed.

According to an embodiment of the present disclosure, the materials of the second dielectric layer 125 and the first dielectric layer 111 may be different from each other, so that an interface may be presented between the first dielectric portion 113-1 and the first dielectric spacer 127-1, and between the second dielectric portion 113-2 and the second dielectric spacer 127-2. Since the thicknesses of the dielectric liners 105-1 and 105-2 are thinner than the thicknesses of the dielectric portions 113-1 and 113-2 and the thicknesses of the dielectric spacers 127-1 and 127-2, the dielectric liners may be ignored here. According to another embodiment of the present disclosure, the material of the second dielectric layer 125 for forming the dielectric spacers and the material of the first dielectric layer 111 for forming the dielectric portions may be the same, however, the second dielectric layer 125 and the first dielectric layer 111 are deposited separately at different process stages, so that an interface may be presented between the first dielectric portion 113-1 and the first dielectric spacer 127-1, and between the second dielectric portion 113-2 and the second dielectric spacer 127-2. In addition, according to the embodiments of the present disclosure, the material of the third dielectric layer 119 in the termination region 100B may be the same as or different from the materials of the second dielectric layer 125 and the first dielectric layer 111 in the cell region 100A.

Next, referring to FIG. 6, at step S219, the first dielectric portion 113-1 and the first dielectric spacers 127-1 constitute a first dielectric cap layer 130-1, and the second dielectric portion 113 and the second dielectric spacers 127-2 constitute a second dielectric cap layer 130-2. The first dielectric cap layer 130-1 and the second dielectric cap layer 130-2 are used as a hard mask, and then the substrate 101 is etched to form a contact opening 129. The contact opening 129 is formed to pass through the source region 121, and the bottom surface of the contact opening 129 is located in the body region 123. According to the embodiments of the present disclosure, there is a second pitch (or referred to as a second critical dimension) P2 between two sidewalls of the contact opening 129, and the second pitch P2 may be substantially equal to the first pitch P1 as shown in FIG. 5. Thereafter, still referring to FIG. 6, at step S221, an ion implantation process is performed through the contact opening 129 to form a heavily doped region 131 in the body region 123. The heavily doped region 131 is located directly below the contact opening 129, and the heavily doped region 131 has the second conductivity type (for example, p-type) that is the same as that of the body region 123. Moreover, the doping concentration of the heavily doped region 131 is higher than the doping concentration of the body region 123. The heavily doped region 131 is, for example, a p-type heavily doped region. Afterwards, a barrier layer 133 is conformally deposited on the sidewalls and the bottom surface of the contact opening 129, and on the sidewalls and the top surfaces of the respective dielectric cap layers. Then, in one embodiment, a conductive material is deposited to fill up the contact opening 129 and over the dielectric cap layers to form a conductive layer 137. In this embodiment, the conductive layer 137 includes an electrode contact 135 in the contact opening 129. The electrode contact 135 is electrically connected to the source region 121 to be used as a source electrode. In other embodiments, an electrode contact 135 is formed by the fabrication method of the embodiments of the present disclosure, and the electrode contact 135 is not limited to be used as a source electrode, which may also be used as a contact for other electrical connections. Moreover, in another embodiment, firstly, a conductive material may be deposited in the contact opening 129 to form an electrode contact 135. In this embodiment, the electrode contact 135 is electrically connected to the source region 121 to be used as a source electrode. In other embodiments, an electrode contact 135 is formed by the fabrication method of the embodiments of the present disclosure, and the electrode contact 135 is not limited to be used as a source electrode, which may also be used as a contact for other electrical connections. Afterwards, another conductive material is deposited over the electrode contact 135 and the respective dielectric cap layers to form a conductive layer 137. In this embodiment, the conductive layer 137 and the electrode contact 135 are in contact with each other to be electrically connected together. The conductive layer 137 may be used as an electrical interconnection layer of the semiconductor devices. In some embodiments, the material of the barrier layer 133 is a conductive material, such as titanium, titanium nitride (TiN), tantalum, tantalum nitride (TaN) or a combination thereof. The material of the electrode contact 135 is, for example, tungsten (W), tungsten-copper alloy, tungsten-silver alloy or other conductive materials. The material of the conductive layer 137 is, for example, aluminum (Al), copper (Cu), platinum (Pt), cobalt (Co) or other conductive materials. The barrier layer 133, the electrode contact 135 and the conductive layer 137 may be formed by a CVD or PVD process.

According to the embodiments of the present disclosure, the contact opening 129 is formed by an etching process and using the aforementioned first dielectric cap layer 130-1 and second dielectric cap layer 130-2 as a hard mask, so that the contact opening 129 is formed without a photolithography process, thereby avoiding the misalignment problem of the photolithography process. Therefore, the position of the electrode contact 135 formed in the contact opening 129 is not shifted. In addition, according to embodiments of the present disclosure, whether between multiple wafers (wafer-to-wafer) or between the center and the edge of a wafer (center-to-edge), the positions of the respective electrode contacts 135 relative to the respective trench electrodes are substantially the same and without a deviation, i.e., the stability of the process of the semiconductor device is improved, thereby improving the stability of the electrical characteristics of the semiconductor devices, such as the stability of threshold voltage (Vth) and on-state resistance (Ron). Meanwhile, since the contact opening 129 is formed by a self-aligned process, the semiconductor devices with reduced size may also be achieved. As shown in FIG. 6, the pitch P of cells may be defined as the pitch between the first trench 103-1 and the second trench 103-2. According to the embodiments of the present disclosure, a trench MOS device may be formed with the pitch P of cells to be, for example, about 0.2 μm to about 0.5 μm, so that more cells may be accommodated per a unit area, thereby increasing the current of the semiconductor devices and reducing the on-state resistance (Ron) of the semiconductor devices.

In the following embodiments, semiconductor devices with self-aligned contacts are further described.

Figure 7:
FIG. 7 is a schematic cross-sectional view of a semiconductor device according to an embodiment of the present disclosure.
Figure 7:
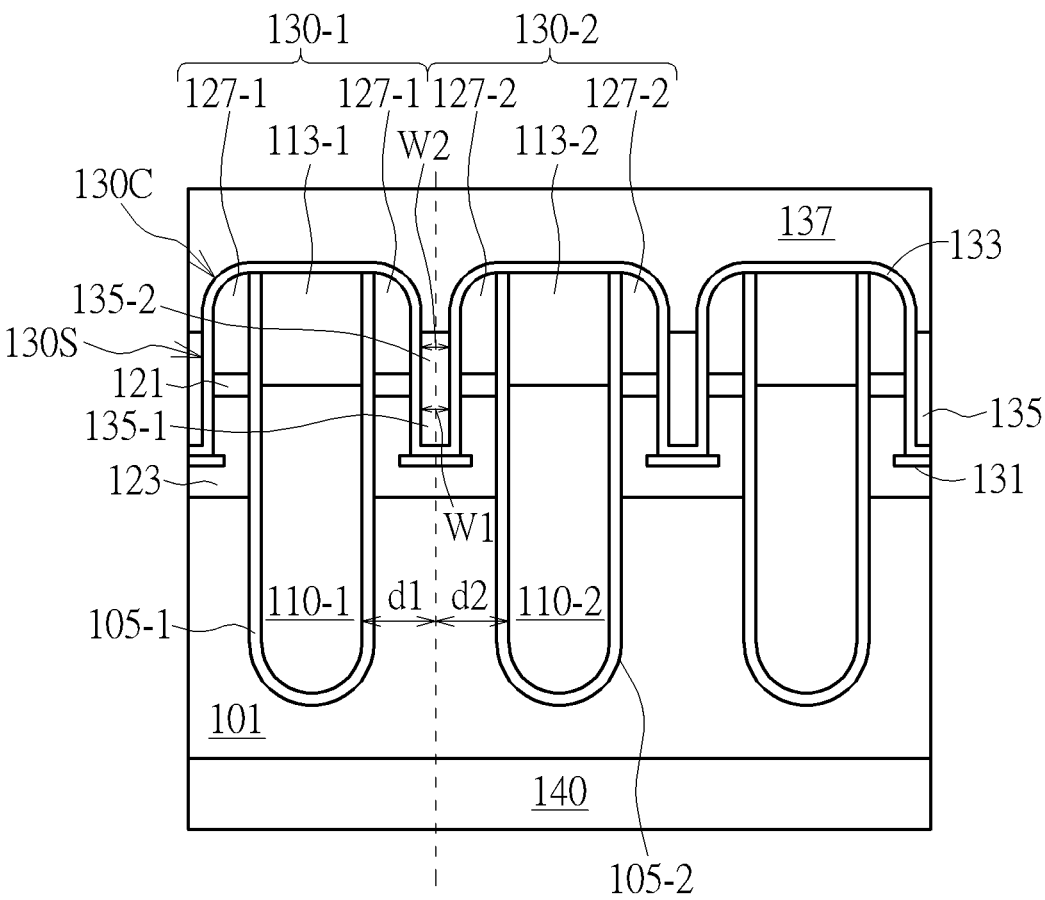

FIG. 7 is a schematic cross-sectional view of a semiconductor device according to an embodiment of the present disclosure. As shown in FIG. 7, in one embodiment, a semiconductor device 100 includes a first trench electrode 110-1 and a second trench electrode 110-2 that are disposed in a substrate 101 and laterally separated from each other. A first dielectric portion 113-1 and a second dielectric portion 113-2 are disposed directly above the first trench electrode 110-1 and the second trench electrode 110-2, respectively. A first dielectric liner 105-1 surrounds the first trench electrode 110-1 and the first dielectric portion 113-1. A second dielectric liner 105-2 surrounds the second trench electrode 110-2 and the second dielectric portion 113-2. Multiple first dielectric spacers 127-1 and multiple second dielectric spacers 127-2 are respectively disposed on the sidewalls of the first dielectric portion 113-1 and on the sidewalls of the second dielectric portion 113-2. The first dielectric portion 113-1 and the first dielectric spacers 127-1 constitute a first dielectric cap layer 130-1. The second dielectric portion 113-2 and the second dielectric spacers 127-2 constitute a second dielectric cap layer 130-2.

According to the embodiments of the present disclosure, the first dielectric portion 113-1 and the second dielectric portion 113-2 are composed of a first dielectric material (for example, the first dielectric layer 111 as shown in FIG. 2). The first dielectric spacers 127-1 and the second dielectric spacers 127-2 are composed of a second dielectric material (for example, the second dielectric layer 125 as shown in FIG. 5). The semiconductor device 100 further includes an electrode contact 135 disposed between the first trench electrode 110-1 and the second trench electrode 110-2. The electrode contact 135 is adjacent to one of the first dielectric spacers 127-1 and one of the second dielectric spacers 127-2. Moreover, a first distance d1 from the center line of the electrode contact 135 to the first trench electrode 110-1 is equal to a second distance d2 from the center line of the electrode contact 135 to the second trench electrode 110-2.

In addition, according to the embodiments of the present disclosure, each of the first dielectric spacers 127-1 and the second dielectric spacers 127-2 has a vertical sidewall 130S and a rounded corner (for example, a rounded corner 130C). The electrode contact 135 is adjacent to these vertical sidewalls 130S of the first dielectric spacer 127-1 and the second dielectric spacer 127-2. The semiconductor device 100 also includes a body region 123 disposed in the substrate 101, a source region 121 disposed on the body region 123, and a heavily doped region 131 disposed in the body region 123. In one embodiment, the electrode contact 135 is a source contact and disposed in the source region 121 and the body region 123. The heavily doped region 131 is located directly below the electrode contact 135. In addition, the first dielectric spacers 127-1 and the second dielectric spacers 127-2 are in contact with the source region 121. The top surface of the electrode contact 135 may be higher than the top surface of the source region 121 and lower than the top surfaces of the first dielectric cap layer 130-1 and the second dielectric cap layer 130-2. The electrode contact 135 includes a first portion 135-1 disposed in the body region 123, and a second portion 135-2 adjacent to one of the first dielectric spacers 127-1. The width W1 of the first portion 135-1 is the same as the width W2 of the second portion 135-2. Moreover, the second portion 135-2 is also adjacent to one of the second dielectric spacers 127-2. In addition, the semiconductor device 100 further includes a conductive layer 137 disposed above the electrode contact 135, the first dielectric cap layer 130-1 and the second dielectric cap layer 130-2. The conductive layer 137 is electrically connected to the electrode contact 135. The semiconductor device 100 further includes a drain electrode 140 disposed on the backside of the substrate 101. In some embodiments, each of the first trench electrode 110-1 and the second trench electrode 110-2 is a polysilicon gate. These polysilicon gates are disposed in the body region 123, the source region 121 and the substrate 101.

Figure 8:
FIG. 8 is a schematic cross-sectional view of a semiconductor device according to another embodiment of the present disclosure.
Figure 8:
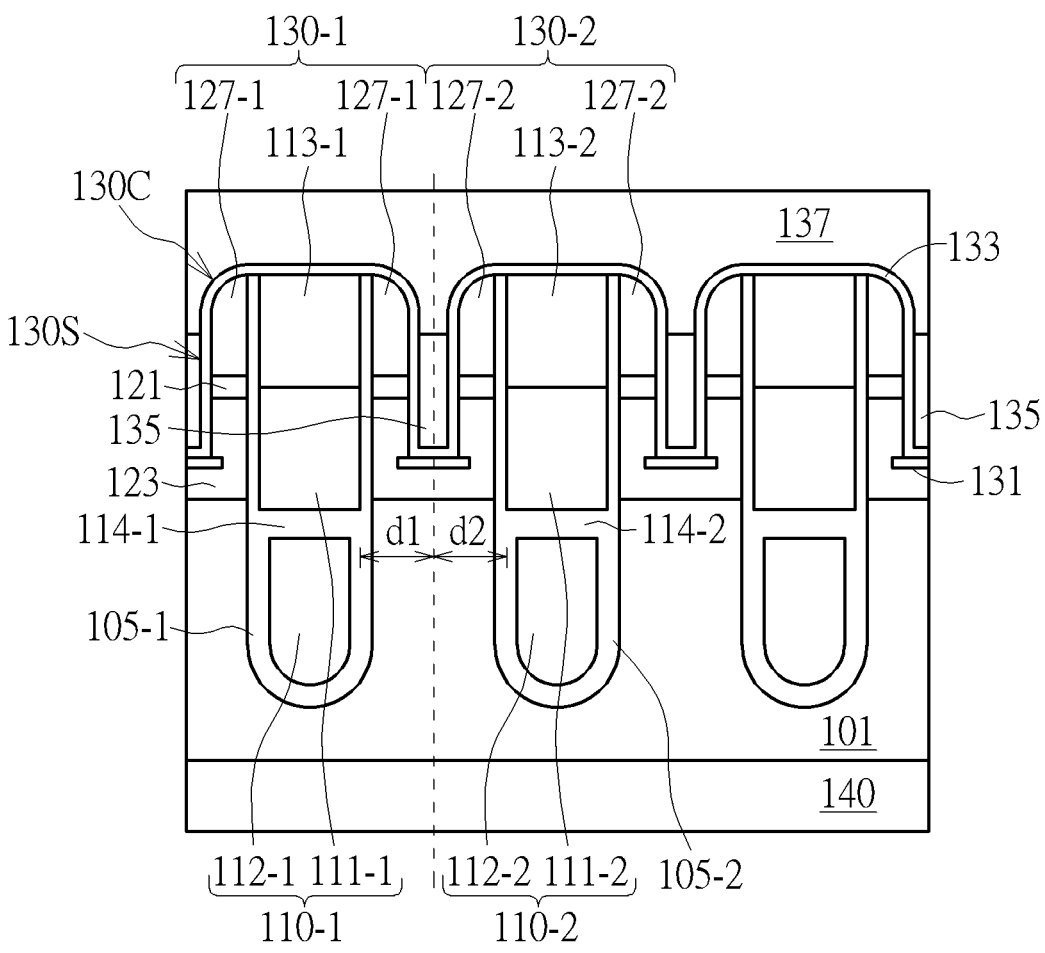

FIG. 8 is a schematic cross-sectional view of a semiconductor device according to another embodiment of the present disclosure. The difference between FIG. 8 and FIG. 7 is that the first trench electrode 110-1 of the semiconductor device 100 in FIG. 8 includes a polysilicon gate 111-1 and a polysilicon field plate 112-1 that are vertically separated from each other. The second trench electrode 110-2 of the semiconductor device 100 in FIG. 8 also includes a polysilicon gate 111-2 and a polysilicon field plate 112-2 that are vertically separated from each other. Therefore, the semiconductor device 100 of FIG. 8 has a split gate structure. In some embodiments, the widths of the polysilicon gates 111-1 and 111-2 may be greater than the widths of the polysilicon field plates 112-1 and 112-2. Moreover, the thicknesses of the lower portions of the dielectric liners 105-1 and 105-2 surrounding the polysilicon field plates 112-1 and 112-2 are greater than the thickness of the upper portions of the dielectric liners 105-1 and 105-2 surrounding these polysilicon gates 111-1 and 111-2. In addition, a dielectric isolation portion 114-1 is disposed between the polysilicon gate 111-1 and the polysilicon field plate 112-1, and a dielectric isolation portion 114-2 is disposed between the polysilicon gate 111-2 and the polysilicon field plate 112-2. In this embodiment, the polysilicon gates 111-1 and 111-2 are disposed in the body region 123 and the source region 121, and the polysilicon field plates 112-1 and 112-2 are disposed in the substrate 101. The polysilicon field plates 112-1 and 112-2 may be electrically connected to the corresponding polysilicon gates 111-1 and 111-2, respectively, or electrically connected to the source region 121. Alternatively, the respective polysilicon field plates 112-1 and 112-2 and the corresponding polysilicon gates 111-1 and 111-2 may respectively constitute a capacitor structure.

The semiconductor devices of the embodiments of the present disclosure have self-aligned contacts to avoid the misalignment problem of the photolithography process, so that the position of the electrode contact between the trench electrodes is not shifted. Accordingly, the stability of the process of the semiconductor devices is improved, thereby improving the electrical stability of the semiconductor devices. In addition, the semiconductor devices of the embodiments of the present disclosure are suitable for trench MOS devices with a reduced pitch of cells, for example, the pitch of cells is about 0.2 μm to about 0.5 μm, thereby accommodating more cells per unit area. Therefore, the current of the semiconductor devices is increased, and the on-state resistance (Ron) of the semiconductor devices is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate, having a first conductivity type;
a body region, disposed on the substrate and having a second conductivity type opposite to the first conductivity type;
a source region, disposed on the body region;
a first trench electrode, passing through the source region, the body region and at least a portion of the substrate;
a first dielectric cap layer, disposed on the first trench electrode, wherein the first dielectric cap layer includes a first dielectric portion and a plurality of first dielectric spacers, the first dielectric portion is located directly above the first trench electrode, and the plurality of first dielectric spacers are located on two opposite sides of the first dielectric portion;
a barrier layer, conformally disposed on the first dielectric portion and the plurality of first dielectric spacers of the first dielectric cap layer;
a first dielectric liner, surrounding sidewalls and a bottom of the first trench electrode and sidewalls of the first dielectric portion; and
a conductive layer, covering the first dielectric portion and the plurality of first dielectric spacers, wherein the conductive layer includes an electrode contact, the electrode contact includes a first portion disposed in the body region, and a second portion adjacent to one of the plurality of first dielectric spacers, the first portion and the second portion have the same width, and a top surface of the electrode contact is lower than a top surface of the first dielectric liner,
wherein each of the plurality of first dielectric spacers has a rounded corner, and the conductive layer includes another part conformally disposed along the rounded corner.

2. The semiconductor device of claim 1, further comprising:
a second trench electrode, disposed in the substrate and laterally separated from the first trench electrode; and
a second dielectric cap layer, disposed on the second trench electrode, wherein the second dielectric cap layer includes a second dielectric portion and a plurality of second dielectric spacers, the second dielectric portion is disposed directly above the second trench electrode, and the plurality of second dielectric spacers are disposed on two opposite sides of the second dielectric portion.

3. The semiconductor device of claim 2, wherein the electrode contact is disposed between the first trench electrode and the second trench electrode, the second portion of the electrode contact is adjacent to one of the plurality of second dielectric spacers, and a first distance from a center line of the electrode contact to the first trench electrode is equal to a second distance from the center line of the electrode contact to the second trench electrode.

4. The semiconductor device of claim 2, wherein each of the first trench electrode and the second trench electrode comprises a polysilicon gate, and the polysilicon gate is disposed in the body region, the source region and the substrate.

5. The semiconductor device of claim 1, wherein the first dielectric liner is disposed between the first dielectric portion and the plurality of first dielectric spacers, each of the plurality of first dielectric spacers has an outer vertical sidewall, an inner vertical sidewall, and the rounded corner, both the outer vertical sidewall and the rounded corner are far from the first dielectric portion, and the inner vertical sidewall is close to the first dielectric portion.

6. The semiconductor device of claim 1, wherein the first dielectric portion is composed of a first dielectric material, and the plurality of first dielectric spacers are composed of a second dielectric material.

7. The semiconductor device of claim 1, further comprising:
a heavily doped region, disposed in the body region, having the second conductivity type and located directly below the electrode contact; and
a drain electrode, disposed on a bottom surface of the substrate.

8. The semiconductor device of claim 1, wherein the plurality of first dielectric spacers are in contact with the source region.

9. The semiconductor device of claim 1, wherein the first trench electrode includes a polysilicon gate and a polysilicon field plate that are vertically separated from each other, the polysilicon gate is disposed in the body region and the source region, and the polysilicon field plate is disposed in the substrate.

10. The semiconductor device of claim 1, wherein a composition of the electrode contact comprises a first conductive material, composition of the another part of the conductive layer comprises a second conductive material, and an interface between the electrode contact and the another part of the conductive layer is lower than a top surface of the first dielectric portion and lower than the rounded corner of each of the plurality of first dielectric spacers.

* * * * *